United States Patent
Yu et al.

(10) Patent No.: US 11,018,294 B2
(45) Date of Patent: *May 25, 2021

(54) METHOD FOR REGULATING PHASE TRANSFORMATION OF HYDROGEN-CONTAINING TRANSITION METAL OXIDE

(71) Applicant: Tsinghua University, Beijing (CN)

(72) Inventors: Pu Yu, Beijing (CN); Nian-Peng Lu, Beijing (CN); Jian Wu, Beijing (CN); Shu-Yun Zhou, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 140 days.

This patent is subject to a terminal disclaimer.

(21) Appl. No.: 16/420,159

(22) Filed: May 22, 2019

(65) Prior Publication Data

US 2019/0280201 A1    Sep. 12, 2019

Related U.S. Application Data

(63) Continuation of application No. PCT/CN2017/112611, filed on Nov. 23, 2017.

(30) Foreign Application Priority Data

Nov. 23, 2016 (CN) .......................... 201611056300.7

(51) Int. Cl.
*H01L 29/66* (2006.01)
*H01L 45/00* (2006.01)
(Continued)

(52) U.S. Cl.
CPC .............. *H01L 45/06* (2013.01); *G02F 1/155* (2013.01); *G02F 1/1524* (2019.01);
(Continued)

(58) Field of Classification Search
CPC ................ H01L 21/222; H01L 21/288; H01L 21/82345; H01L 43/02; H01L 43/10;
(Continued)

(56) References Cited

U.S. PATENT DOCUMENTS 6,964,827 B2    11/2005    Barker et al.
7,666,550 B2     2/2010    Chia et al.
(Continued)

FOREIGN PATENT DOCUMENTS

CN        1340213        3/2002
CN        1367546        9/2002
(Continued)

OTHER PUBLICATIONS

International Search Report of PCT/CN2017/112611.
(Continued)

*Primary Examiner* — Brook Kebede

(57) ABSTRACT

A method for regulating a phase transformation of a hydrogen-containing transition metal oxide comprises steps of: providing a hydrogen-containing transition metal oxide having a structural formula of $ABO_xH_y$, wherein the hydrogen-containing transition metal oxide is in form of a first phase, A is one or more of alkaline earth metal elements and rare-earth metal elements, B is one or more of transition metal elements, x is a numeric value in a range of 1 to 3, and y is a numeric value in a range of 0 to 2.5; soaking the hydrogen-containing transition metal oxide with a first ionic liquid capable of providing hydrogen ions and oxygen ions; and applying a gating voltage to the hydrogen-containing transition metal oxide with the first ionic liquid as a gate to regulate the phase transformation of the hydrogen-containing transition metal oxide.

11 Claims, 15 Drawing Sheets provide a hydrogen-containing transition metal oxide having a structural formula of $ABO_xH_y$ soak the hydrogen-containing transition metal oxide with a first ionic liquid applying a gating voltage to the hydrogen-containing transition metal oxide through the first ionic liquid as a gate to regulate the phase transformation of the hydrogen-containing transition metal oxide

(51) Int. Cl.

| | |
|---|---|
| *G02F 1/1524* | (2019.01) |
| *G02F 1/1523* | (2019.01) |
| *G02F 1/155* | (2006.01) |
| *H01L 43/02* | (2006.01) |
| *H01L 43/10* | (2006.01) |
| *H01L 43/12* | (2006.01) |
| *H01L 21/8234* | (2006.01) |
| *H01L 21/288* | (2006.01) |
| *H01L 21/22* | (2006.01) |

(52) U.S. Cl.
CPC .......... *G02F 1/1525* (2013.01); *H01L 21/222* (2013.01); *H01L 21/288* (2013.01); *H01L 21/82345* (2013.01); *H01L 43/02* (2013.01); *H01L 43/10* (2013.01); *H01L 43/12* (2013.01); *H01L 45/00* (2013.01); *H01L 45/08* (2013.01); *H01L 45/1253* (2013.01); *H01L 45/147* (2013.01); *H01L 45/1608* (2013.01)

(58) Field of Classification Search
CPC ......... H01L 43/12; H01L 45/00; H01L 45/06; H01L 45/08; H01L 45/1253; H01L 45/147; H01L 45/1608; G02F 1/1524; G02F 1/1525; G02F 1/155
USPC ......................................................... 438/155
See application file for complete search history.

(56) References Cited

U.S. PATENT DOCUMENTS

| | | |
|---|---|---|
| 2007/0085052 A1 | 4/2007 | Lee et al. |
| 2014/0234752 A1 | 8/2014 | Park et al. |
| 2018/0241082 A1* | 8/2018 | Suzuki .............. H01M 10/0567 |

FOREIGN PATENT DOCUMENTS

| | | |
|---|---|---|
| CN | 1574215 | 2/2005 |
| CN | 1740377 | 3/2006 |
| CN | 1776912 | 5/2006 |
| CN | 1934033 | 3/2007 |
| CN | 101136453 | 3/2008 |
| CN | 101624206 | 1/2010 |
| CN | 101918337 | 12/2010 |
| CN | 102132408 | 7/2011 |
| CN | 102683348 | 9/2012 |
| CN | 102282098 | 12/2014 |
| CN | 1903423 | 1/2017 |
| EP | 2793279 | 10/2014 |
| JP | 2009054884 | 3/2009 |

OTHER PUBLICATIONS

Topotactic Phase Transformation of the Brownmillerite $SrCoO_{2.5}$ to the Perovskite $SrCoO_{3-\delta}$, Jeen, H. et al., Advanced Materials, vol. 25, Sep. 19, 2013, ISSN:0935-9648, pp. 3651-3656.

* cited by examiner

METHOD FOR REGULATING PHASE TRANSFORMATION OF HYDROGEN-CONTAINING TRANSITION METAL OXIDE

CROSS-REFERENCE TO RELATED APPLICATIONS

This application claims all benefits accruing under 35 U.S.C. § 119 from China Patent Application No. 201611056300.7, filed on Nov. 23, 2016 in the State Intellectual Property Office of China, the content of which is hereby incorporated by reference. This application is a continuation under 35 U.S.C. § 120 of international patent application PCT/CN2017/112611 filed on Nov. 23, 2017, the content of which is also hereby incorporated by reference.

TECHNICAL FIELD

The present disclosure relates to a transition metal oxide, in particular to a method for regulating a phase transformation of a hydrogen-containing transition metal oxide.

BACKGROUND

A thermology method is adopted to hydrogenate an oxide. For example, the oxide can be reduced by some hydrides such as $CaH_2$ and $NaH$ under heating. H ions would substitute O of the oxide to form H-M bonds (M is a transition metal). Since the H-M bond is shorter than M-O, the hydrogenated oxide exhibits a characteristic of reduced lattice volume. The hydrogenation to the transition metal oxide, on one hand, changes the lattice structure of the transition metal oxide, and on the other hand, changes an electrical or magnetic property of the material due to the accompanied doping of electron or hole. In addition, the oxygen of the oxide sometimes may be carried away during the hydrogenation so as to form a structural phase with an oxygen vacancy. Some hydrogen-containing oxides, such as hydrogenated $LaSrCoO_3$, $BaTiO_3$, $VO_2$, $TiO_2$, and the like, have been made by a hydrogen thermal reduction method. In addition to the hydrogenation method, a structural transition of an oxide material can also be achieved by a thermal oxidation method. For example, a transformation from $SrCoO_{2.5}$ with a brownmillerite structure to $SrCoO_3$ with a perovskite structure can be achieved by a high oxygen pressure oxidation method. Besides, there are some other methods now, such as an electrochemical method.

The above methods are all restricted to a regulation between two phases. However, there is no hydrogen-containing transition metal oxide capable of achieving a tri-state phase transformation and no method for regulating the hydrogen-containing transition metal oxide by an electric field to achieve the tri-state phase transformation.

SUMMARY

In view of this, for the problems as described above, a hydrogen-containing transition metal oxide and a method for regulating the hydrogen-containing transition metal oxide by an electric field to achieve a tri-state phase transformation are provided.

A method for regulating a phase transformation of a hydrogen-containing transition metal oxide includes steps of:

S100, providing a hydrogen-containing transition metal oxide having a structural formula of $ABO_xH_y$, wherein the hydrogen-containing transition metal oxide is in form of a first phase, A is one or more of alkaline earth metal elements and rare-earth metal elements, B is one or more of transition metal elements, x is a numeric value in a range of 1 to 3, and y is a numeric value in a range of 0 to 2.5;

S200, soaking the hydrogen-containing transition metal oxide with a first ionic liquid, wherein water in the first ionic liquid is capable of being decomposed into hydrogen ions and oxygen ions under an action of an electric field; and S300, applying a gating voltage to the hydrogen-containing transition metal oxide through the first ionic liquid as a gate to regulate the phase transformation of the hydrogen-containing transition metal oxide.

In one embodiment, a method for making the hydrogen-containing transition metal oxide includes steps of:

S110, providing a transition metal oxide having a structural formula of $ABO_z$, wherein z is greater than or equal to 2 and smaller than or equal to 3;

S120, soaking the transition metal oxide with a second ionic liquid, wherein water in the second ionic liquid is capable of providing hydrogen ions and oxygen ions under an action of an electric field; and S130, applying an electric field to the transition metal oxide to cause the hydrogen ions in the second ionic liquid to insert into the transition metal oxide.

In one embodiment, the step S110 includes steps of:

S112, providing a substrate;

S114, depositing a film of the transition metal oxide having the structural formula of $ABO_z$ onto a surface of the substrate; and S116, forming a first electrode on a surface of the film of the transition metal oxide.

In one embodiment, the substrate is one of a ceramic substrate, a silicon substrate, a glass substrate, a metal substrate, or a polymer. In the step S114, the film of the transition metal oxide is obtained via an epitaxial growth on the substrate by using a pulsed laser deposition method.

In one embodiment, in the step S116, the first electrode contacts the film of the transition metal oxide to form a bottom electrode.

In one embodiment, the step S130 includes steps of:

S132, providing a second electrode and a power source;

S134, disposing the second electrode to be spaced from the first electrode and electrically and respectively connecting the second electrode and the first electrode to the power source;

S136, soaking the second electrode with the second ionic liquid, and applying an electric field in a direction from the second electrode to the first electrode by the power source.

In one embodiment, the step S300 includes a step of:

S310, applying a negative gating voltage to the hydrogen-containing transition metal oxide $ABO_xH_y$ to extract the hydrogen ions from or insert the oxygen ions into the hydrogen-containing transition metal oxide so as to cause the hydrogen-containing transition metal oxide to be in form of a second phase, wherein the second phase has a lattice volume smaller than that of the first phase.

In one embodiment, the step S300 includes a step of:

S320, applying a positive gating voltage to the hydrogen-containing transition metal oxide in the form of the second phase to insert the hydrogen ions into or extract the oxygen ions from the hydrogen-containing transition metal oxide in the form of the second phase so as to cause the hydrogen-containing transition metal oxide in the form of the second phase to revert back to the first phase.

In one embodiment, the step S300 includes a step of:

S330, applying a negative gating voltage to the hydrogen-containing transition metal oxide in the form of the second phase to insert the oxygen ions into or extract the hydrogen ions from the hydrogen-containing transition metal oxide in the form of the second phase so as to be in form a third phase, the third phase has a lattice volume smaller than that of the second phase.

In one embodiment, the $ABO_xH_y$ is $SrCoO_{2.5}H$.

In the present disclosure, the method for regulating the ionic liquid gating voltage is provided to achieve the electric field controlled phase transformation of the hydrogen-containing transition metal oxide at room temperature, so that the corresponding electrical, optical, and magnetic properties can be simultaneously regulated, for example, electric field induced effects, such as a metal-insulator transformation, an electrochromic effect in dual bands (visible light and infrared light), and a tri-state magnetoelectric coupling are achieved. Through these results, an understanding to the electric field controlled ionic storage and transportation is deepen, an exploration to the corresponding basic principle and practical application are achieved, and a basis is provided for a design of a novel crystal structure with particular functions.

DETAILED DESCRIPTION

For a clear understanding of the objects, the technical solutions, and advantages of the present disclosure, a method for regulating a tri-state phase transformation of a hydrogen-containing transition metal oxide of the present disclosure will now be described in detail with reference to the accompanying drawings and embodiments. It is to be understood that the specific embodiments as described herein is merely to illustrate the present disclosure, and is not intended to limit the present disclosure.

Figure 1:
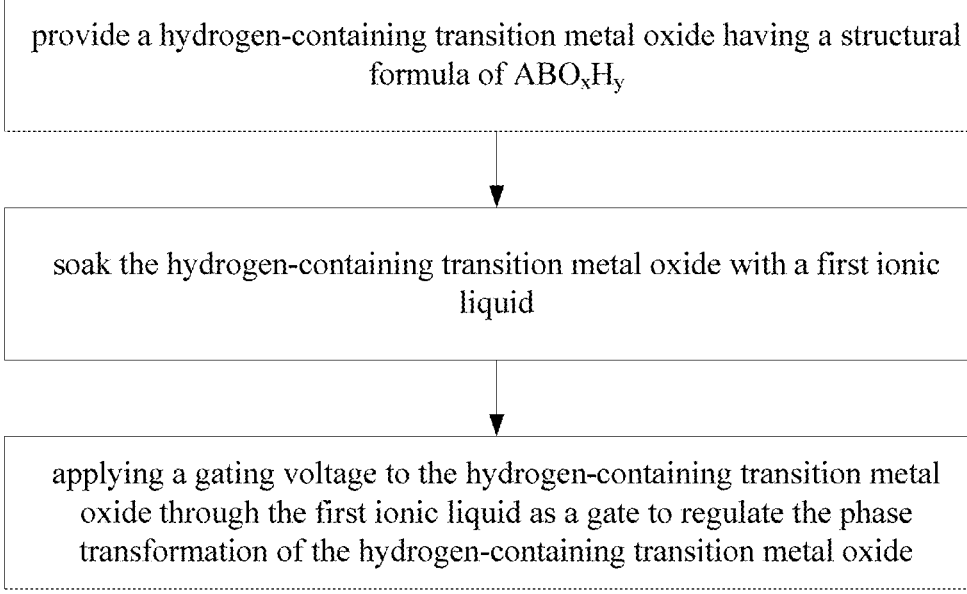
FIG. 1 shows a flowchart of a method for regulating a tri-state phase transformation of a hydrogen-containing metal transition oxide, provided in embodiments of the present disclosure.

Referring to FIG. 1, embodiments of the present disclosure include a method for regulating a phase transformation of a hydrogen-containing transition metal oxide, specifically including steps of:

S100, providing a hydrogen-containing transition metal oxide having a structural formula of $ABO_xH_y$, wherein the hydrogen-containing transition metal oxide is in form of a first phase, A is one or more of alkaline earth metal elements and rare-earth metal elements, B is one or more of transition metal elements, x is a numeric value in a range of 1 to 3, and y is a numeric value in a range of 0 to 2.5;

S200, soaking the hydrogen-containing transition metal oxide with a first ionic liquid, wherein the first ionic liquid is capable of providing hydrogen ions and oxygen ions; and S300, applying a gating voltage to the hydrogen-containing transition metal oxide through the first ionic liquid as a gate to regulate the phase transformation of the hydrogen-containing transition metal oxide.

The hydrogen-containing transition metal oxide has the structural formula of $ABO_xH_y$, wherein A is one or more of alkaline earth metal elements and rare-earth metal elements, B is one or more of transition metal elements, x is a numeric value in a range of 1 to 3, and y is a numeric value in a range of 0 to 2.5. A ratio of A and B in $ABO_xH_y$ may not be exactly 1:1, since a deviation from exact 1:1 may have occurred due to existence of a vacancy and an interstitial atom. Therefore, hydrogen-containing transition metal oxides having ratios of A and B approaching 1:1 are all within the scope of the application. Preferably, x is a numeric value in a range of 2 to 3, and y is a numeric value in a range of 1 to 2.5. The alkaline earth metal elements can include one or more of Be, Mg, Ca, Sr, and Ba. The rare-earth metal elements can include La, Ce, Pr, Nd, Pm, Sm, Eu, Gd, Tb, Dy, Ho, Er, Tm, Yb, and the like. The transition metal elements can include one or more of Co, Cr, Fe, Mn, Ni, Cu, Ti, Zn, Sc, and V. It is to be understood that A also can be an alloy of an alkaline earth metal and a rare-earth metal, and B also can be an alloy of a transition metal and a main group metal. The first ionic liquid can be various types of ionic liquids. In one embodiment, the ionic liquid is DEME-TFSI. While this effect can be generalized to other ionic liquids, ionic salts, polymers, and polar materials, as long as the required hydrogen ions and oxygen ions can be provided therefrom by hydrolyzing or other manner and the insertion and extraction of corresponding ions for the material can be realized therein.

The hydrogen-containing transition metal oxide $ABO_xH_y$ has a stable crystal structure at a normal temperature, and an addition and a subtraction of hydrogen and an addition and a subtraction of oxygen for the hydrogen-containing transition metal oxide soaked with the ionic liquid can be achieved under an action of an electric field by using a method of regulating an ionic liquid gating voltage at a normal temperature, so as to be able to achieve: a phase transformation from a first phase to a second phase and a phase transformation from the second phase back to the first phase; a phase transformation from the first phase to a third phase and a phase transformation from the third phase to the first phase; and a phase transformation from the second phase to the third phase and a phase transformation from the third phase to the second phase. The first phase has a lattice volume larger than that of the second phase and the second phase has a lattice volume larger than that of the third phase. It should be understood that a cyclic transformation among the above three structural phases can be further achieved by the method of regulating the ionic liquid gating voltage. Since the hydrogen-containing transition metal oxide has different physical properties when in the form of the above three structural phases, an application on an electron device can be achieved by the transformation among the above three phases. The materials have different molecular formulas in the forms of the three phases. The material in the form of the first phase is the hydrogen-containing transition metal oxide $ABO_xH_y$. The second phase is achieved by extracting hydrogen from or inserting oxygen into the hydrogen-containing transition metal oxide $ABO_xH_y$ by the method of regulating the ionic liquid gating voltage based upon the hydrogen-containing transition metal oxide $ABO_xH_y$. The third phase is achieved by further extracting hydrogen from or inserting oxygen into the hydrogen-containing transition metal oxide $ABO_xH_y$ based on the second phase by the method of regulating the ionic liquid gating voltage based upon the hydrogen-containing transition metal oxide $ABO_xH_y$. In one embodiment, the tri-state phase transformation is to achieve a transformation among three phases $ABO_xH_y$, $ABO_{2.5}$, and $ABO_{3-\delta}$. Meanwhile, the above transformation can form a reversible structural transition among three quite different phases under a control of an electric field. Moreover, the three structural phases have quite different electrical, optical, and magnetic properties.

In one embodiment, a method for making the hydrogen-containing transition metal oxide $ABO_xH_y$ specifically includes steps of:

S110, providing a transition metal oxide having a structural formula of $ABO_z$, wherein z is greater than or equal to 2 and smaller than or equal to 3;

S120, soaking the transition metal oxide with a second ionic liquid, wherein the second ionic liquid is capable of providing hydrogen ions and oxygen ions; and S130, applying an electric field to the transition metal oxide to cause the hydrogen ions in the second ionic liquid to insert into the transition metal oxide.

In step S110, A is one or more of alkaline earth metal elements and rare-earth metal elements. B is one or more of transition metal elements Co, Cr, Fe, Mn, Ni, Cu, Ti, Zn, Sc, V, and the like. The alkaline earth metal elements can include Be, Mg, Ca, Sr, and Ba. The rare-earth metal elements can include one or more of La, Ce, Pr, Nd, Pm, Sm, Eu, Gd, Tb, Dy, Ho, Er, Tm, Yb, and the like. A form of the transition metal oxide having the structural formula of $ABO_z$ is not limited and can be a film, a powder, a bulk material, a nano-particle, or a material composited with other material. In one embodiment, the transition metal oxide having the structural formula of $ABO_z$ is in form of a film. It is to be understood that a method for making the film of the transition metal oxide is not limited and the film of the transition metal oxide can be made by a variety of methods.

In one embodiment, the step S110 includes steps of:

S112, providing a substrate;

S114, depositing a film of the transition metal oxide having the structural formula of $ABO_z$ onto a surface of the substrate; and S116, forming a first electrode on a surface of the film of the transition metal oxide.

The substrate is not limited and can be one of a ceramic substrate, a silicon substrate, a glass substrate, a metal substrate, or a polymer. Any substrate can be used for forming a film thereon can be used in the step S112. A method for forming the film of the transition metal oxide having the structural formula of $ABO_z$ is not limited and can be various film forming methods, such as an ion sputtering method, a chemical vapor deposition method, a magnetron sputtering method, a gelation method, a laser pulse deposition method, etc. In one embodiment, in step S114, the film of the transition metal oxide is obtained via an epitaxial growth on the substrate by using a pulsed laser deposition method. A thickness of the grown film of the transition metal oxide is not limited. Preferably, the film of the transition metal oxide has a thickness from 5 nm to 200 nm. In step S116, the first electrode contacts the film of the transition metal oxide to form a bottom electrode. It is to be understood that the first electrode can be located at a surface of the film of the transition metal oxide closing the substrate, or located at a surface of the film of the transition metal oxide away from the substrate. The first electrode can be a metal or various conductive films and the film of the transition metal oxide itself. In one embodiment, the first electrode is an ITO film. The second ionic liquid is identical to the first ionic liquid and can be various types of ionic liquids. In one embodiment, the ionic liquid is DEME-TFSI.

In step S120, one second ionic liquid layer can be formed on a surface of the transition metal oxide. The second ionic liquid can be various types of ionic liquids, as long as the ionic liquid is able to provide the required hydrogen ion and oxygen ion by hydrolyzing or other manner and cover the transition metal oxide. When the transition metal oxide and the ionic liquid are in an electrical field, the hydrogen ion and the oxygen ion in the second ionic liquid can be controlled to be inserted into or otherwise extracted from the transition metal oxide by a direction of the electrical field.

It is to be understood that in step S130, a variety of methods can be used to apply the electrical field to the transition metal oxide. In one embodiment, the step S130 includes steps of:

S132, providing a second electrode and a power source;

S134, spacing the second electrode from the first electrode, and connecting the second electrode and the first electrode electrically and respectively to the power source; and S136, soaking the second electrode with the second ionic liquid, and applying an electric field in a direction from the second electrode to the first electrode by the power source.

In step S132, a shape of the second electrode is not limited. The second electrode can be a parallel-plate electrode, a rod-like electrode, or a metal mesh electrode. In one embodiment, the second electrode is an electrode formed by a spring-like metal wire. The power source can be various power sources, such as direct current power sources, alternating current power sources, etc. A voltage of the power source is adjustable so as to be used for controlling a period of a reaction.

In step S134, the second electrode is disposed to be spaced from the first electrode, so that a directed electric field can be formed between the second electrode and the first electrode. Connection manners of the second electrode and the first electrode to the direct current power source are not limited. The application of the voltage to the first electrode and the second electrode can be controlled by a switch.

In step S136, the second electrode is soaked with the second ionic liquid. When power is applied to the first electrode and the second electrode, the first electrode can be connected to a negative pole of the direct current power source, and the second electrode can be connected to a positive pole of the direct current power source, so that the electric field in the direction from the second electrode to the first electrode can be generated between the first electrode and the second electrode. Since the second ionic liquid exists between the first electrode and the second electrode, the positively charged hydrogen ions in second the ionic liquid will move toward the first electrode under the action of the electric field, so the hydrogen ions will be collected on the surface of the film of the transition metal oxide and further inserted into the transition metal oxide, thereby obtaining the hydrogen-containing transition metal oxide. The negatively charged oxygen ions will be extracted from the sample and enter into the ionic liquid. It is to be understood that when the electric field is inverted, the ion change process as described above will also be correspondingly inverted. Therefore, upon the change of the electric field, the process as described above is a reversible process.

In step S200, the adopted first ionic liquid can be the same as the second ionic liquid in the step S120. That is, the step S300 can be directly performed after the step S136. It is to be understood that when the hydrogen-containing transition metal oxide is directly provided, one first ionic liquid layer can be formed on a surface of the hydrogen-containing transition metal oxide. The first ionic liquid can be various types of ionic liquids, as long as the ionic liquid is able to provide the required hydrogen ions and oxygen ions by hydrolyzing or other manner and cover the transition metal oxide. When the transition metal oxide and the first ionic liquid are in an electrical field, the hydrogen ions and the oxygen ions in the ionic liquid can be controlled to be inserted into or otherwise extracted from the transition metal oxide by a direction of the electrical field.

In step S300, the first ionic liquid layer covered on the surface of the hydrogen-containing transition metal oxide can be used as a gate. A hydrogen amount and an oxygen amount in the hydrogen-containing transition metal oxide can be adjusted by applying a negative gating voltage or a positive gating voltage to the first ionic liquid layer so as to achieve the phase transformation. In one embodiment, the step S300 includes a step of:

S310, applying a negative gating voltage to the hydrogen-containing transition metal oxide $ABO_xH_y$ to extract the hydrogen ions from or insert the oxygen ions into the hydrogen-containing transition metal oxide so as to cause the hydrogen-containing transition metal oxide to be in form of a second phase, wherein the second phase has a lattice volume smaller than that of the first phase.

In step S310, when the first ionic liquid on the surface of the hydrogen-containing transition metal oxide $ABO_xH_y$ is used as the gate, and the negative gating voltage is applied onto the hydrogen-containing transition metal oxide $ABO_xH_y$, the hydrogen ions in the hydrogen-containing transition metal oxide $ABO_xH_y$ are extracted out or the oxygen ions are inserted into the hydrogen-containing transition metal oxide $ABO_xH_y$, so that the lattice gets smaller, and the second phase having a lattice volume smaller than that of the first phase can be obtained after a period of time. The second phase refers to a phase transformed from the hydrogen-containing transition metal oxide when the lattice becomes small. On the other hand, it can be found that a transmittance of the hydrogen-containing transition metal oxide $ABO_xH_y$ is reduced after a period of time. It can be visually observed that a transparent color is changed to a brown color. A transmittance of the second phase is changed. The transmittance of the second phase is decreased in comparison with the transmittance of the first phase. Therefore, an electrochromism can be achieved by the above method.

In one embodiment, the step S300 can further include a step of:

S320, applying a positive gating voltage to the hydrogen-containing transition metal oxide in the form of the second phase to insert the hydrogen ions into or extract the oxygen ions from the hydrogen-containing transition metal oxide in the form of the second phase so as to cause the hydrogen-containing transition metal oxide in the form of the second phase to revert back to the first phase.

It is to be understood that the steps S320 and S310 are reversible. With the first ionic liquid as the gate, by applying the positive gating voltage to the hydrogen-containing transition metal oxide in the form of the second phase, the hydrogen ions are inserted into or the oxygen ions are extracted from the hydrogen-containing transition metal oxide in the form of the second phase so as to revert back to the first phase. Therefore, the electrochromism is achieved.

In one embodiment, the step S300 can further include a step of:

S330, applying a negative gating voltage to the hydrogen-containing transition metal oxide in the form of the second phase to insert the oxygen ions into or extract the hydrogen ions from the hydrogen-containing transition metal oxide in the form of the second phase so as to be in form a third phase, wherein the third phase has a lattice volume smaller than that of the second phase.

It is to be understood that a visible light transmittance of the third phase is smaller than a visible light transmittance of the second phase, the third phase is black visually, and an infrared light transmittance of the third phase is smaller than an infrared light transmittance of the second phase, so that the electrochromism can be achieved.

It is to be understood that the step S330 is reversible, by applying a positive gating voltage to the hydrogen-containing transition metal oxide in the form of the third phase, the oxygen ions are extracted from or the hydrogen ions are inserted into the hydrogen-containing transition metal oxide in the form of the third phase so as to revert back to the second phase.

A film of strontium cobalt oxide $SrCoO_xH_y$ with different hydrogen amounts and oxygen amounts can be obtained by the method of regulating the ionic liquid gating voltage. In one embodiment, the hydrogen-containing transition metal oxide $ABO_xH_y$ can be any one of $SrCoO_{2.8}H_{0.82}$, $SrCoO_{2.5}H$, $SrCoO_3H_{1.95}$, and $SrCoO_{2.5}H_{2.38}$.

Figure 2:
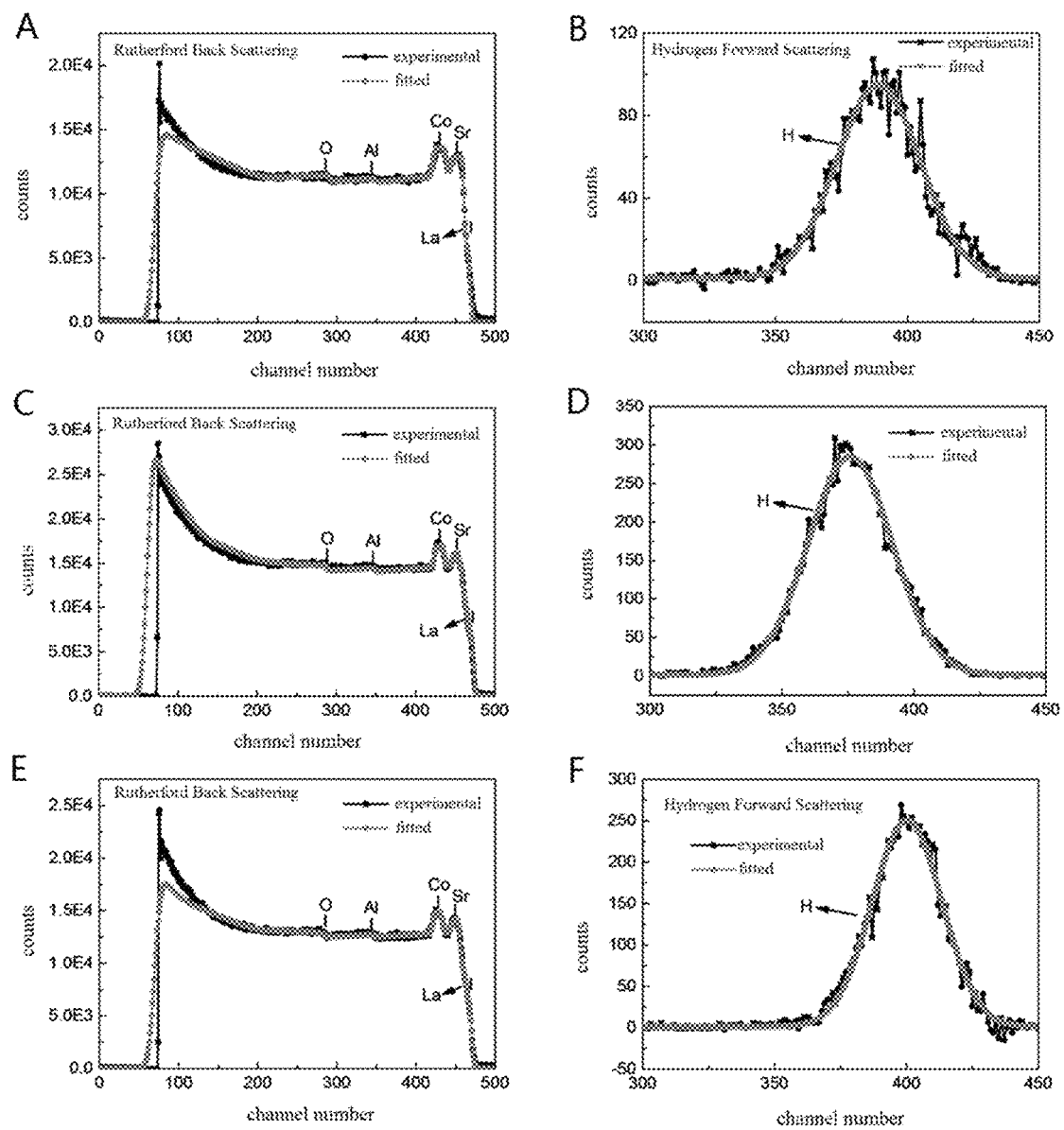
FIG. 2 shows test curves of Rutherford Back Scattering (RBS) and Hydrogen Forward Scattering (HFS) of $SrCoO_{2.8}H_{0.82}$ (A, B), $SrCoO_3H_{1.95}$ (C, D), and $SrCoO_{2.5}H_{2.38}$ (E, F), provided in embodiments of the present disclosure.

Referring to FIG. 2, in order to determine the hydrogen amount and oxygen amount in the $SrCoO_xH_y$ film obtained by the method as described above, hydrogen amounts and oxygen amounts in three types of $SrCoO_xH_y$ films are quantitatively measured by a method combining Hydrogen Forward Scattering with Rutherford Back Scattering. According to the measurement result, obtained ratios of Co atom to H atom in different films are 1:0.82 (FIGS. 2A and 2B), 1:1.95 (FIGS. 2C and 2D), and 1:2.38 (FIGS. 2E and 2F) respectively. Stoichiometric ratios of elements of three types of $SrCoO_xH_y$ are $SrCoO_{2.8}H_{0.82}$, $SrCoO_3H_{1.95}$, and $SrCoO_{2.5}H_{2.38}$ respectively. A topological phase transformation among three quite different phases achieved under a control of an invertible electric field can be provided for all of $SrCoO_{2.8}H_{0.82}$, $SrCoO_3H_{1.95}$, and $SrCoO_{2.5}H_{2.38}$, and these three structural phases have quite different electrical, optical, and magnetic properties. The hydro-containing transition metal oxide $ABO_xH_y$ can be any one $SrCoO_{2.8}H_{0.82}$, $SrCoO_{2.5}H$, $SrCoO_3H_{1.95}$, and $SrCoO_{2.5}H_{2.38}$.

Taking $SrCoO_{2.5}H$ as an example, a phase transformation among three phases $SrCoO_{2.5}$, $SrCo_{3-\delta}$, and $SrCoO_{2.5}H$ is described as below, wherein $SrCoO_{2.5}H$ corresponds to a first phase, $SrCoO_{2.5}$ corresponds to a second phase, and $SrCoO_{3-\delta}$ corresponds to a third phase.

Figure 3:
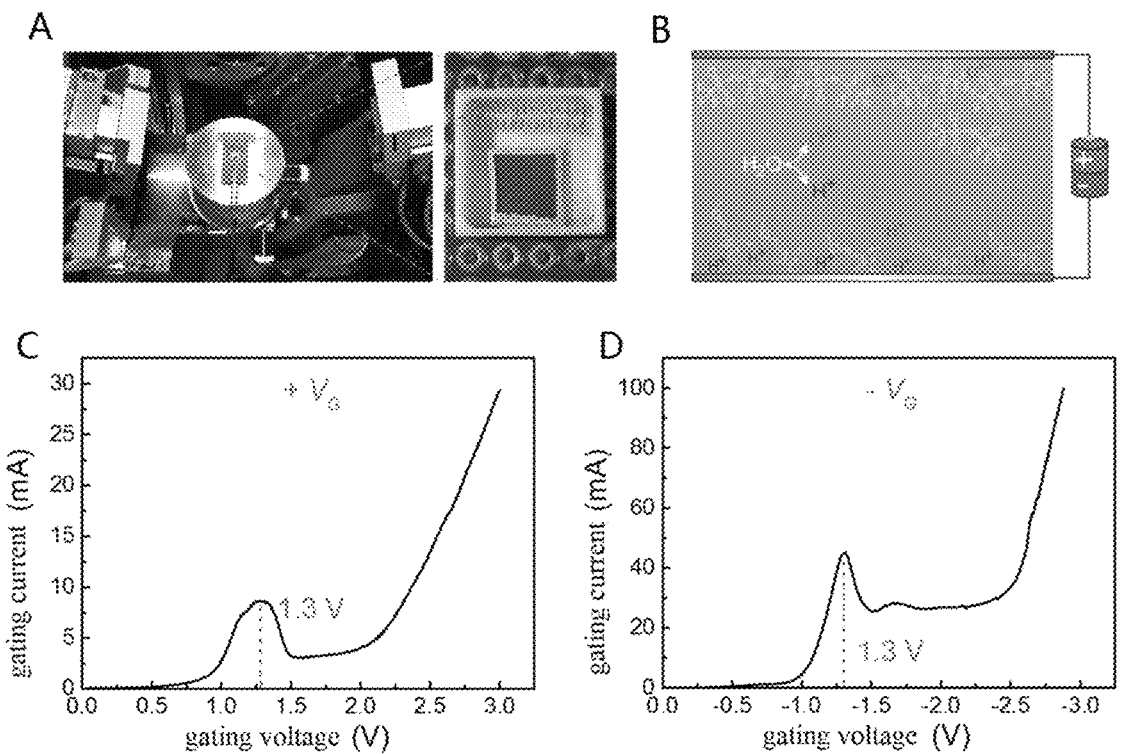
FIG. 3 is a diagram of an apparatus and a principle for a method for regulating an ionic liquid gating voltage, provided in embodiments of the present disclosure.

Referring to FIG. 3, an apparatus for controlling the phase transformation of $SrCoO_{2.5}H$ by a gating voltage is shown. A preparation of a new phase $SrCoO_{2.5}H$ and a reversible and nonvolatile transformation among the three structural phases under a control of an electric field at room temperature are achieved by using the method of regulating the ionic liquid gating voltage via the apparatus shown in FIG. 3. In FIG. 3, a silver conductive adhesive is coated as an electrode on an edge of a $SrCoO_{2.5}H$ film and a surface of the $SrCoO_{2.5}H$ film is covered by an ionic liquid. A spiral Pt electrode spaced from the silver conductive adhesive is the other electrode. In the present embodiment, an ionic liquid DEME-TFSI is used, in which the required hydrogen ions and oxygen ions for the transformation can be obtained by hydrolyzing a water molecule therein. While this effect can be generalized to other ionic liquids, ionic salts, polymers, polar materials, and so on, as long as the required hydrogen ions and oxygen ions can be obtained therefrom and enabled to be inserted into the material or extracted from the material under a drive of an electric field.

Figure 4:
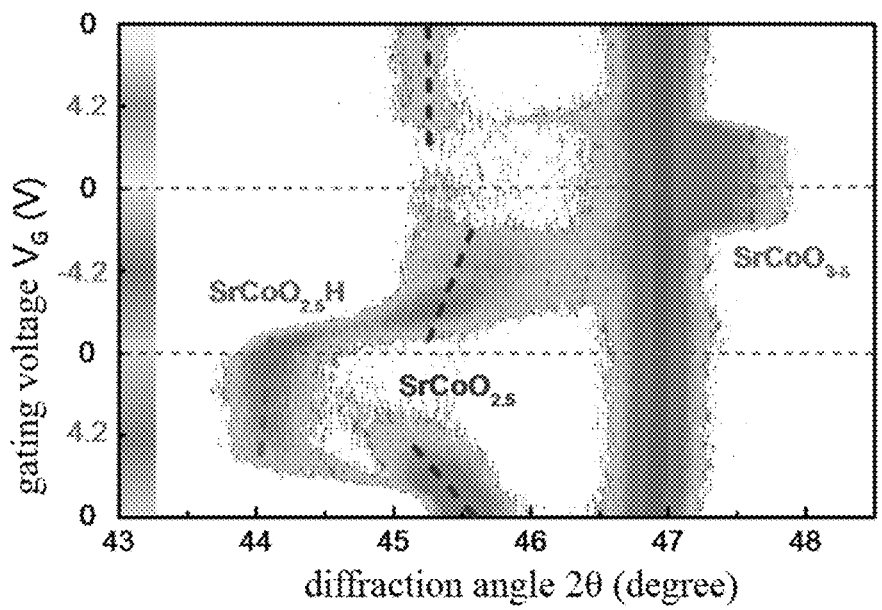
FIG. 4 shows a variation of diffraction peak of XRD in the method for regulating the ionic liquid gating voltage, wherein the corresponding phases are $SrCoO_{2.5}$, $SrCoO_{3-\delta}$, and $SrCoO_{2.5}H$, respectively.

Referring to FIG. 4, this figure shows an in situ XRD of a tri-state phase transformation controlled by the method of regulating the gating voltage. As it can be seen, in the ionic liquid, when a positive gating voltage (an increasing rate of the voltage is 2 mV/s) is applied to a $SrCoO_{2.5}$ film, the (004) diffraction peak at 45.7° diminishes gradually and eventually disappears, while a diffraction peak corresponding to the new phase starts to develop at 44.0°, suggesting that the new structural phase $SrCoO_{2.5}H$ is obtained. When gradually changing to a negative gating voltage, the new phase $SrCoO_{2.5}H$ reverts back to $SrCoO_{2.5}$ quickly, when further increasing the negative gating voltage, $SrCoO_{2.5}H$ is transformed to a $SrCoO_{3-\delta}$ phase having a perovskite structure. In addition, the structure transition can also be modulated reversibly by regulating the in situ electric field. When changing to positive gating voltages, $SrCoO_{3-\delta}$ phase reverts back to $SrCoO_{2.5}$ phase and $SrCoO_{2.5}H$ quickly. Therefore, a reversible structure transition among the $SrCoO_{2.5}$ phase having the brownmillerite structure, the $SrCoO_{3-\delta}$ phase having the perovskite structure, and the $SrCoO_{2.5}H$ phase is achieved by controlling the electric field. An important feature is that these regulated new phases are nonvolatile, that is, when the electric field is removed, their structural phases and respective physical properties are still kept.

Figure 5:
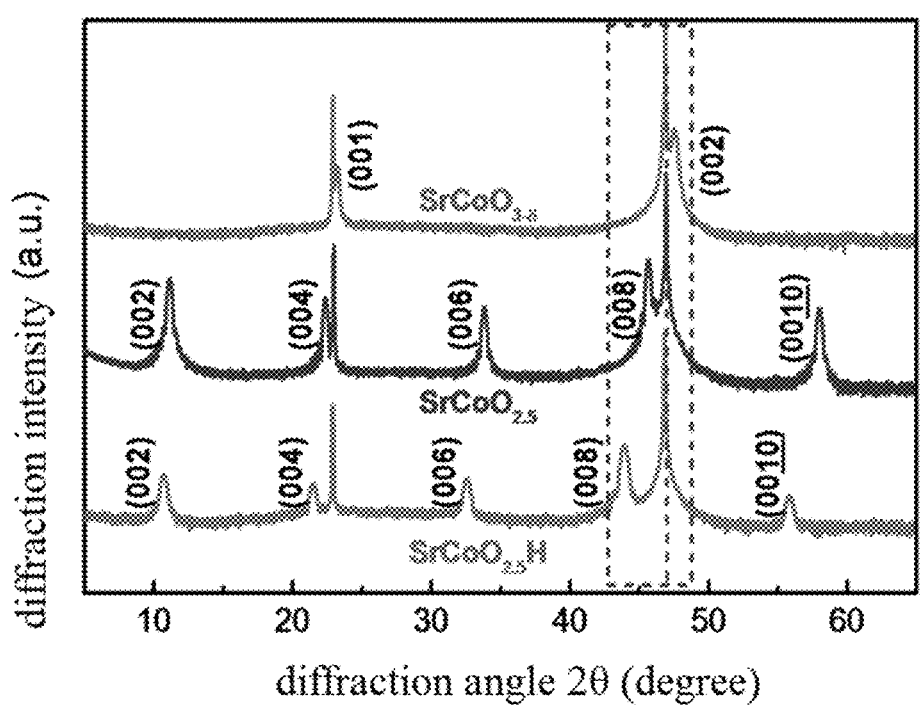
FIG. 5 shows structural characterization spectra of X-ray diffraction of $SrCoO_{2.5}$, $SrCoO_{3-\delta}$, and $SrCoO_{2.5}H$, provided in embodiments of the present disclosure.
Figure 6:
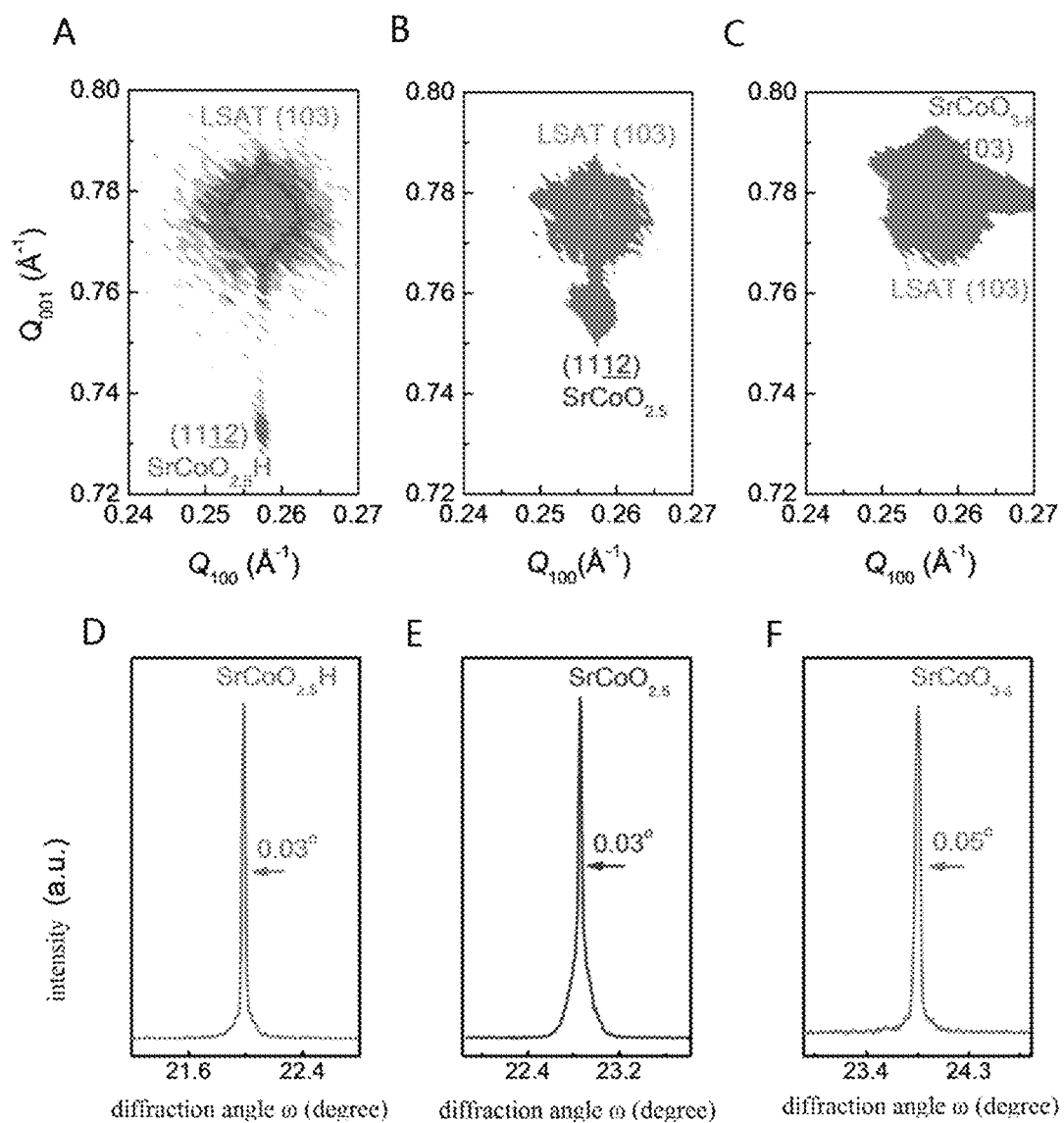
FIG. 6 shows a characterization of the crystal quality of a film before and after the regulation to the ionic liquid gating voltage, provided in embodiments of the present disclosure.
Figure 7:
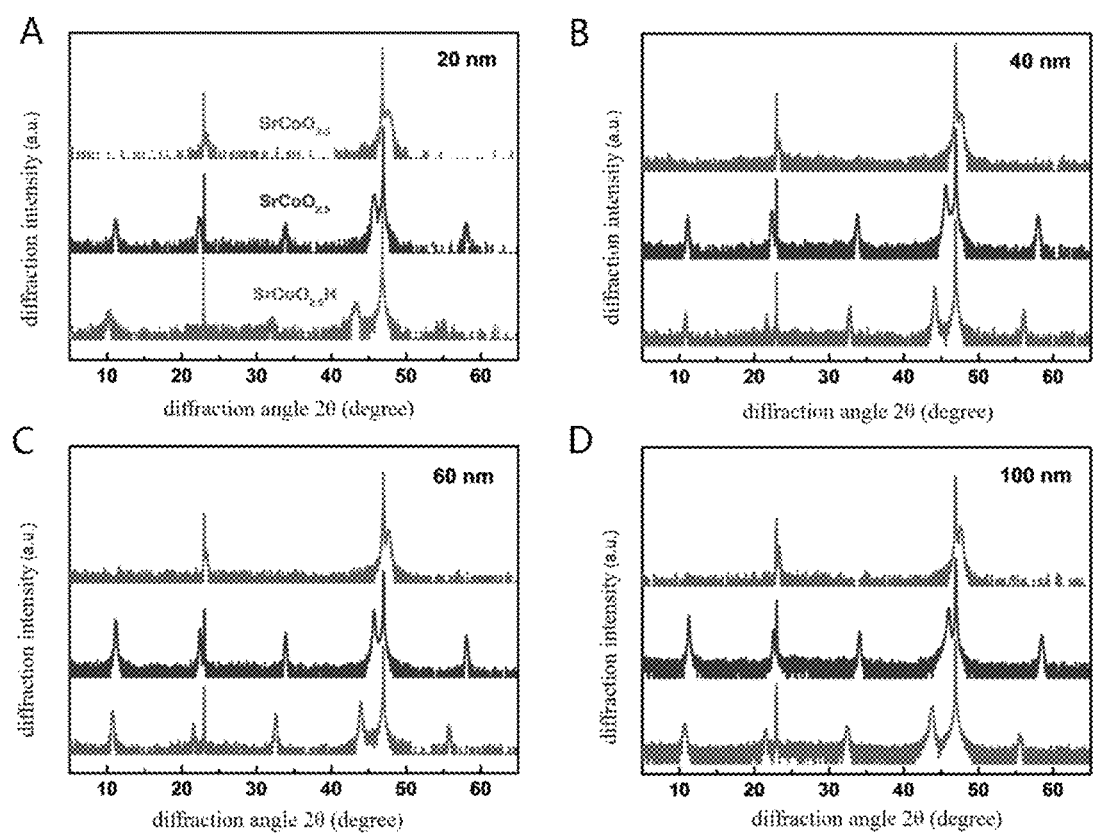
FIG. 7 shows XRD of three phases with different thicknesses, (A) 20 nm, (B) 40 nm, (C) 60 nm, and (D) 100 nm, respectively, provided in embodiments of the present disclosure.
Figure 8:
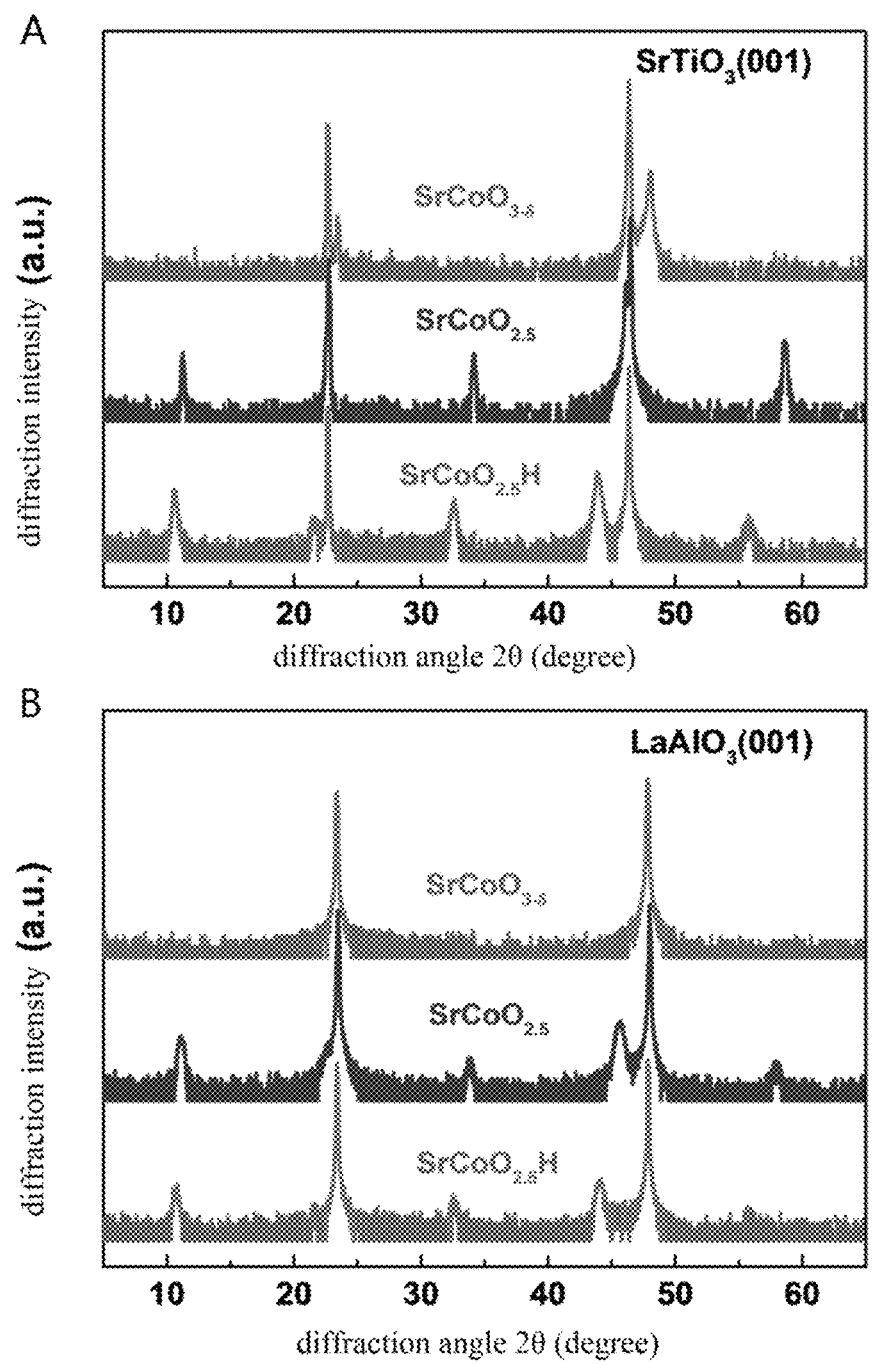
FIG. 8 shows ex-situ XRD results of the $SrCoO_{2.5}$ phase on substrates with different stresses, $SrTiO_3$ (001) (A) and $LaAlO_3$ (001) (B), after the regulation to the ionic liquid gating voltage, provided in embodiments of the present disclosure.

Referring to FIG. 5, X-ray diffraction patterns of three structural phases $SrCoO_{2.5}$, $SrCoO_{3-\delta}$, and $SrCoO_{2.5}H$ are shown. In comparison with the $SrCoO_{3-\delta}$ phase having the perovskite structure, the $SrCoO_{2.5}$ phase having the brownmillerite structure exhibits a series of superstructure peaks derived from an alternating arrangement of oxygen octahedron and oxygen tetrahedron in an out-of-plane direction. Pseudo-cubic c-axis lattice constants of $SrCoO_{2.5}$ and $SrCoO_{3-\delta}$ structures are respectively 0.397 nm and 0.381 nm based upon respective Bragg diffraction angles. The new phase $SrCoO_{2.5}H$ also has a series of superstructure diffraction peaks, suggesting that the $SrCoO_{2.5}H$ structure has a long range periodic lattice structure the same as the $SrCoO_{2.5}$ structure. The new phase $SrCoO_{2.5}H$ has a c-axis lattice constant of 0.411 nm which increases by 3.7% and 8.0% respectively compared to these of $SrCoO_{2.5}$ and $SrCoO_{3-\delta}$. In addition, referring to FIG. 6, the three structural phases $SrCoO_{2.5}$, $SrCoO_{3-\delta}$, and $SrCoO_{2.5}H$ have almost the same rocking curve full width at half maximum (FWHM) and in-plane lattice constant identical to the substrate (in-plane Q values of reciprocal spaces are consistent), suggesting that the films after the in situ growth and gating voltage controlling still remain of high crystalline quality. Furthermore, referring to FIG. 7 and FIG. 8, films with different thicknesses (from 20 nm to 100 nm) grown on LSAT(001) and films with different stresses grown on STO (001) and LAO(001) substrates are provided, and similar results are obtained, which fully demonstrates the effectiveness and intrinsic nature of the reversible tri-state phase transformation among the three phases $SrCoO_{2.5}$, $SrCoO_{3-\delta}$, and $SrCoO_{2.5}H$. That is, this effect has no connection with a stress and a thickness or a dimension of a material and can be generalized to material systems of various structural forms.

Figure 9:
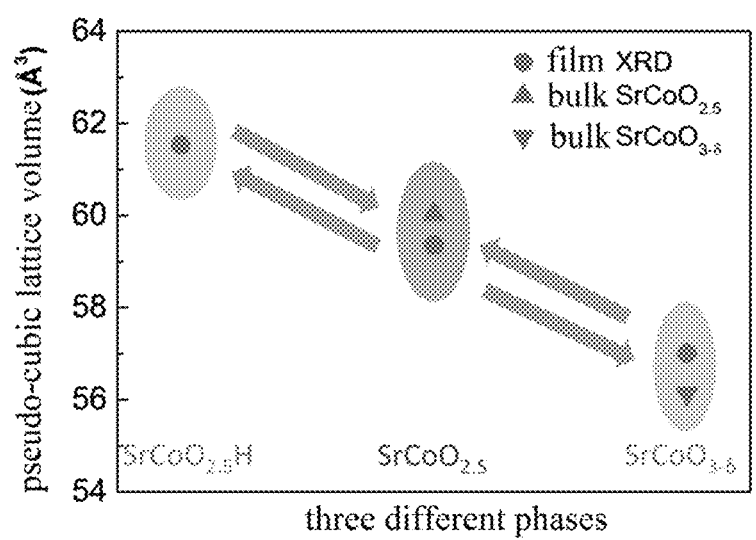
FIG. 9 shows pseudo-cubic lattice volumes obtained from XRD corresponding to the three structural phases, provided in embodiments of the present disclosure.

Referring to FIG. 9, a comparison of lattice volumes of the three structures obtained from XRD measurements with known bulk materials $SrCoO_3$ and $SrCoO_{2.5}$ is shown. It can be seen from FIG. 9 that the lattice volume of the first phase is greater than the lattice volume of the second phase, and the lattice volume of the second phase is greater than the lattice volume of the third phase.

Figure 10:
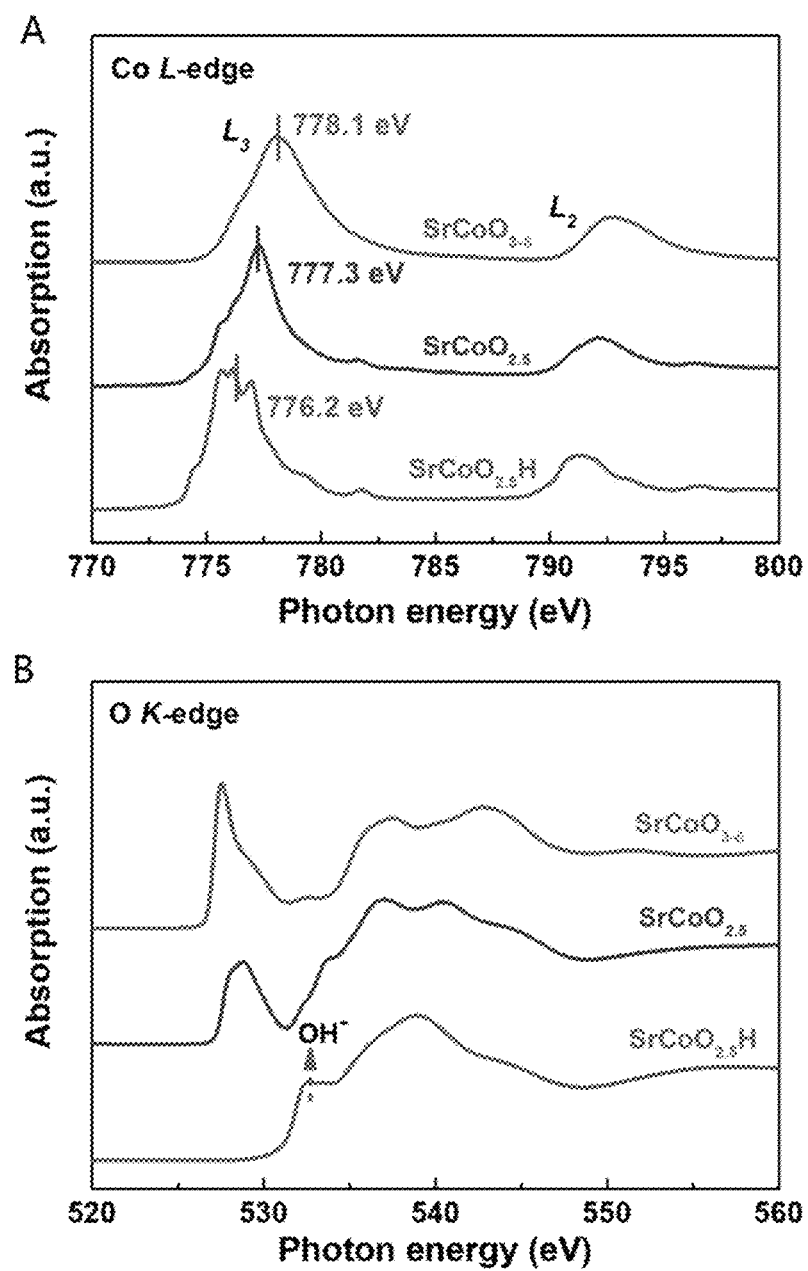
FIG. 10 shows absorption spectroscopies at an L-edge of Co (A) and at a K-edge of O (B) of the three phases, $SrCoO_{2.5}$, $SrCoO_{3-\delta}$, and $SrCoO_{2.5}H$, provided in embodiments of the present disclosure.

Referring to FIG. 10, the X-ray absorption spectroscopy at the L-absorption edge of Co and K-absorption edge of O in each of the three structure phases $SrCoO_{2.5}$, $SrCoO_{3-\delta}$, and $SrCoO_{2.5}H$ is measured in order to thoroughly understand the electronic structure of the new phase $SrCoO_{2.5}H$. A transition of an electron of Co from 2p orbital to 3d orbital is detected at $L_{2,3}$-absorption edge of Co and can be the basis for determining a valence state of corresponding compound. As shown in FIG. 10A, the peak positions of the L-absorption edges of Co are gradually shifted toward high-energy end from the new phase $SrCoO_{2.5}H$ to the $SrCoO_{2.5}$ phase and then to the $SrCo_{3-\delta}$ phase, suggesting an gradual increase in valence states. In particular, the new phase $SrCoO_{2.5}H$ has almost the same absorption spectroscopy characteristics, shape of the spectroscopy and peak position, as these of CoO, which suggests that Co in the new phase $SrCoO_{2.5}H$ has a valence state of +2. At the same time, the X-ray absorption spectroscopy of Co in the $SrCoO_{2.5}$ phase is also well in conformity with the previous studies, that is, Co in the $SrCoO_{2.5}$ phase is +3 valent. The peak position of the $L_3$-absorption edge of Co in the $SrCoO_{3-\delta}$ phase is about 0.8 eV larger than that of the $SrCoO_{2.5}$ phase, suggesting that less oxygen vacancy ($\delta<0.1$) is possessed in the $SrCoO_{3-\delta}$ phase. In addition, the electronic states of the three structural phases are further studied by measuring K absorption spectroscopies of O (FIG. 10b), in which K absorption of O is to measure a transition between 1 s occupied orbital of O and unoccupied 2p orbital of O. Compared with K-absorption edge of O in $SrCoO_{3-\delta}$, in the $SrCoO_{2.5}$ phase, the peak position at 527.5 eV is significantly weaken and the peak position at 528.5 eV is significantly enhanced, suggesting a transformation thereof from a complete oxygen octahedral coordination to a partial oxygen octahedral and partial oxygen tetrahedral coordination. However, in the new phase, the absorption peak at 528 eV completely disappeared, suggesting that the oxygen-cobalt hybridization has been suppressed to a great extent.

Figure 11:
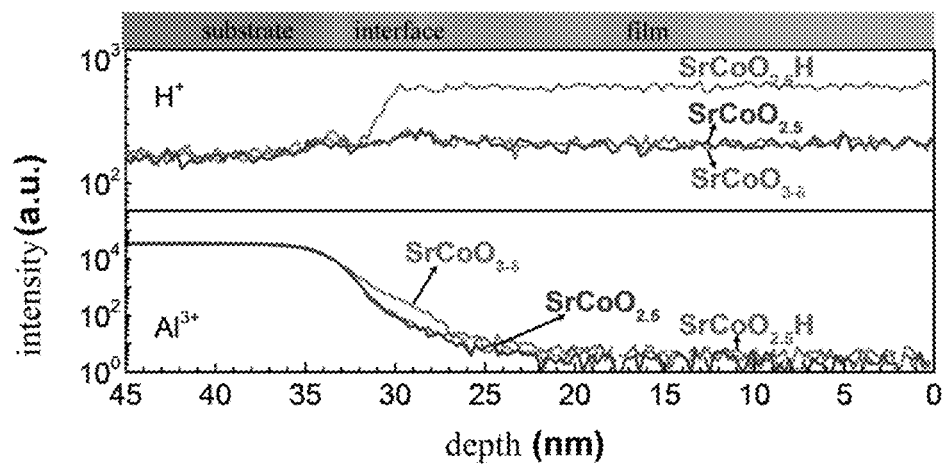
FIG. 11 shows depth dependent relationships of concentrations of H atom and Al atom in the three phases, $SrCoO_{2.5}$, $SrCoO_{3-\delta}$, and $SrCoO_{2.5}H$ measured by a secondary-ion mass spectrometry, provided in embodiments of the present disclosure.

Referring to FIG. 11, to verify the insertion of the hydrogen ion into the $SrCoO_{2.5}$ lattice, depth dependent curves of H elements and Al elements (from the LSAT substrate) in the three structural phases are measured by a secondary-ion mass spectrometry method. Compared to the LSAT substrate and the other two phases, a significant H signal in the new phase clearly verifies that a large amount of hydrogen atoms have been inserted into the $SrCoO_{2.5}$ lattice and are uniformly distributed in the new phase. According to the test of absorption spectroscopy as described above again, the experimental evidence can determine that the Co ion has a valence state of +2, therefore, it is determined that the new phase has a structural formula of $SrCoO_{2.5}H$. In addition, a strong adsorption peak at 532.5 eV in K-adsorption edge of O (FIG. 10B) is a result from O—H bond, which provides a powerful evidence for the presence of $H^+$ ion in the new phase.

Figure 12:
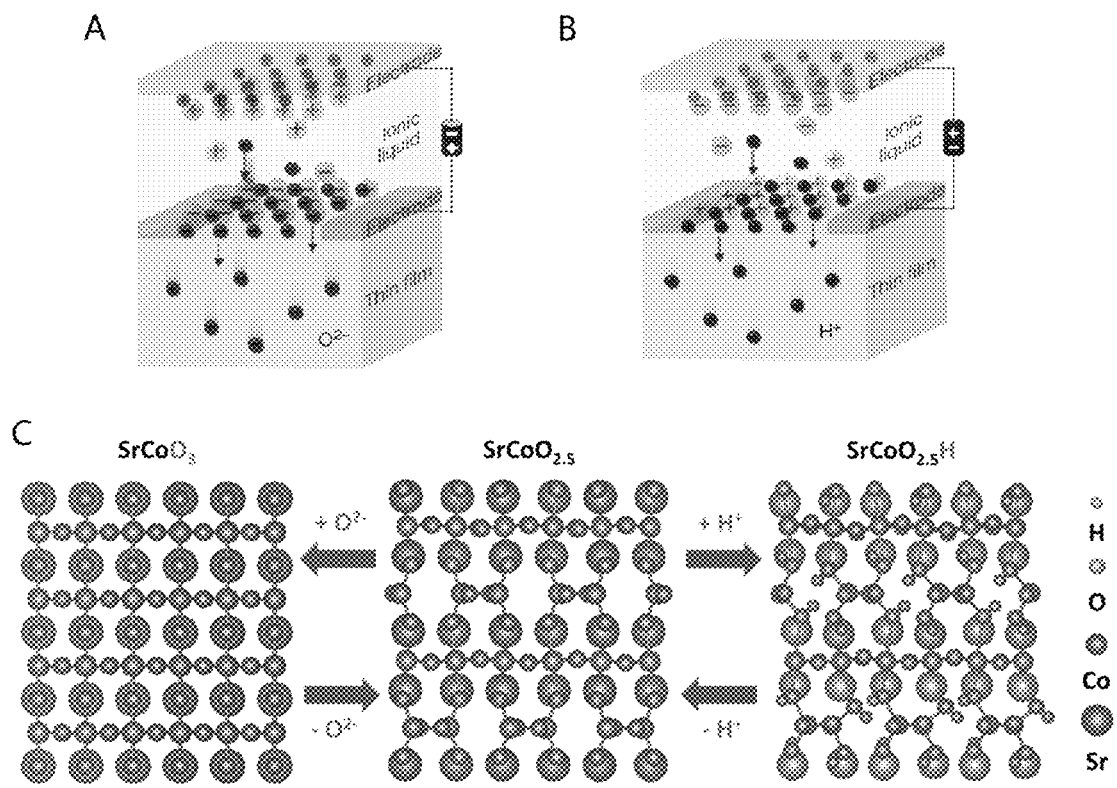
FIG. 12 shows a method for making a new phase $ABO_xH_y$, and a regulating method among three phases, provided in embodiments of the present disclosure.

Referring to FIG. 12, a process of regulating the ionic liquid gating voltage and a reversible regulation thereof to the three phases are summarized. In this structure, $SrCoO_3$ has a perovskite structure, in which the Co ion is surrounded by oxygen ions to form an oxygen octahedral structure. $SrCoO_{2.5}$ has a brownmillerite structure. An alternating arrangement of an octahedron and a tetrahedron is formed by the material because every two Co ions lose one oxygen ion compared with $SrCoO_3$. While in $SrCoO_{2.5}H$, the hydrogen ion is connected to the oxygen ion in the oxygen tetrahedron to form a OH bond. A reversible structural transition among these three structures can be achieved by the insertion and extraction of the oxygen ion and the hydrogen ion under a drive of an electric field.

Figure 13:
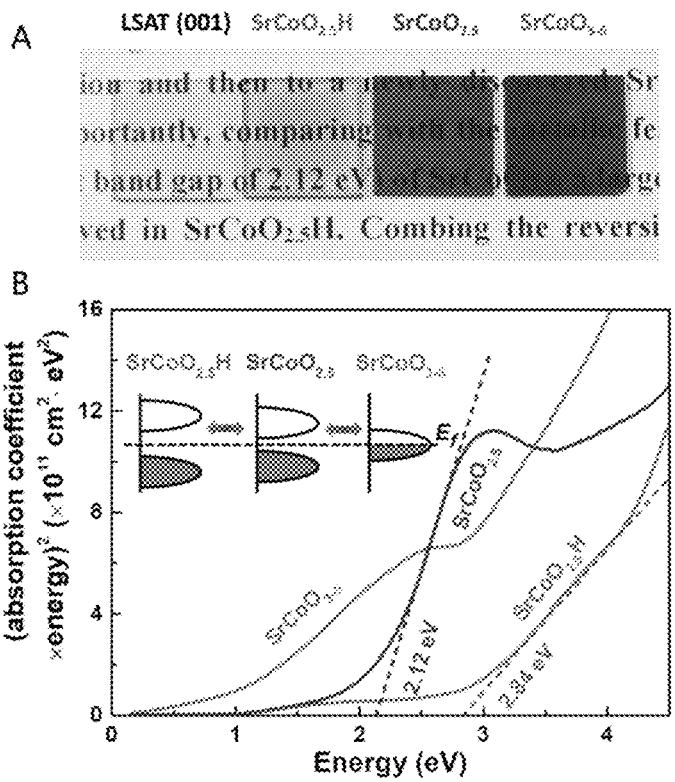
FIG. 13 shows photos of the three structural phases and a variation of the optical bandgap of the three structural phases, provided in embodiments of the present disclosure.

Referring to FIG. 13, photos of the three phases and variation of energy gaps thereof are provided. Referring to FIG. 13A, a material object comparison of transmittance among the three different phases $SrCoO_{2.5}$, $SrCoO_{3-\delta}$, and $SrCoO_{2.5}H$ each having a thickness of 50 nm and grown on the LSAT(001) substrate is shown, in which $SrCoO_{2.5}H$ corresponds to the first phase, $SrCoO_{2.5}$ corresponds to the second phase, and $SrCoO_{3-\delta}$ corresponds to the third phase. The transmittances of the three structural phases can be seen from FIG. 13A. It can be found that $SrCoO_{2.5}H$ and the LSAT (001) substrate appear as colorless, $SrCoO_{2.5}$ appears as brown, while the $SrCoO_{3-\delta}$ phase appears as black. In combination with the structural transition controlled by the electric field, it can be found that this method can be a very effective mean to realize an electrochromic effect. In order to distinguish the different optical absorption properties of the three structural phases more intuitively, FIG. 13B shows the direct bandgaps of the three structural phases. Through fitting with a formula $(\alpha\omega)^2$-$\omega$, it can be found that compared with $SrCoO_{3-\delta}$ having a metallic nature and $SrCoO_{2.5}$ having a semiconductor property (direct bandgap: 2.12 eV), the new phase $SrCoO_{2.5}H$ having $Co^{2+}$ has a direct bandgap reaching 2.84 eV, and the figures contained therein also show the variation of respective bandgap during the structural transition clearly.

Figure 14:
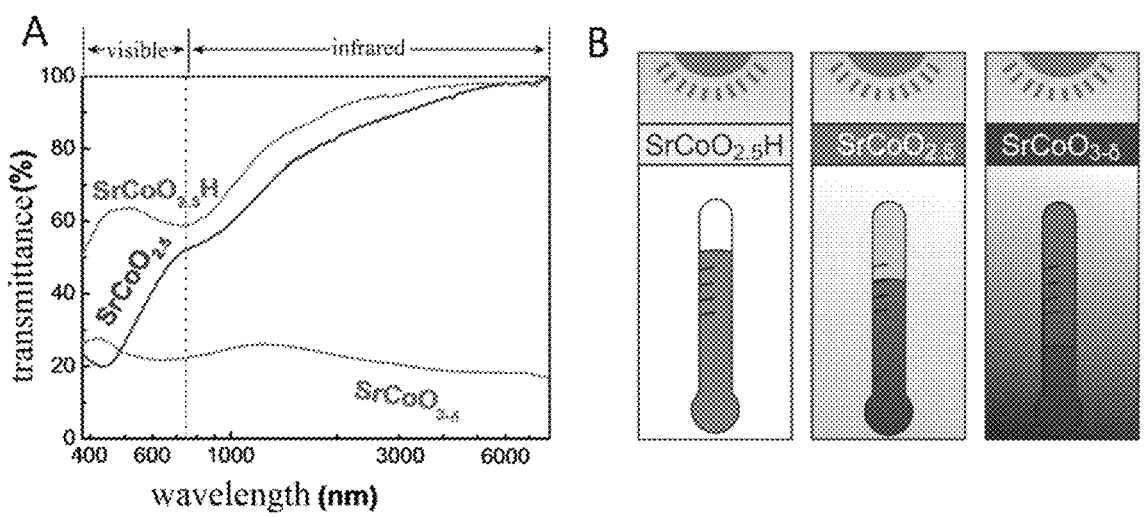
FIG. 14 shows different electrochromic transmittance spectra of the three structural phases and a schematic diagram of a smart glass, provided in embodiments of the present disclosure.

Referring to the corresponding optical transmission spectra (A) in FIG. 14, a dual-band electrochromic effect possessed by the tri-state phase transformation is also shown clearly. The $SrCoO_{2.5}H$ phase (the first phase) has a transmittance over 30% greater than these of the other two phases in the visible light region, and the transmittance of the $SrCoO_{2.5}H$ phase (the first phase) and the $SrCoO_{2.5}$ phase (the second phase) are 60% greater than that of the $SrCoO_{3-\delta}$ phase (the third phase) in the infrared region (the wavelength reaches 8000 nm). In addition, (B) of FIG. 14 shows differences in permeability and thermal effect (i.e. the principle of a smart glass) from a regulation to infrared and visible light bands. In combination with the reversible phase transformation controlled by the electric field, the $SrCoO_{2.5}H$ herein provides a great application prospect for the electrochromism, that is, an electric field regulation to a photopermeability can be performed selectively and independently at an infrared band and a visible light band by way of regulating a gate voltage. More specifically, when in the first phase (the $SrCoO_{2.5}H$ phase), for example, since the permeabilities of the infrared section and the visible light section are relatively high, it is achievable that more infrared rays and visible light enter into a room at the same time, so that the temperature and the brightness are relatively high in the room. While when in the second phase (the $SrCoO_{2.5}$ phase), since the absorption at the visible light section is significant, a low brightness but a relatively high temperature can be achieved in the room. While when in the third phase (the $SrCoO_{3-\delta}$ phase), due to the simultaneous absorption at the visible light and infrared bands, a low brightness and a relatively low temperature can be achieved in the room. Therefore, the tri-state phase transformation realized by the material broadens the application scope of the smart glass.

Figure 15:
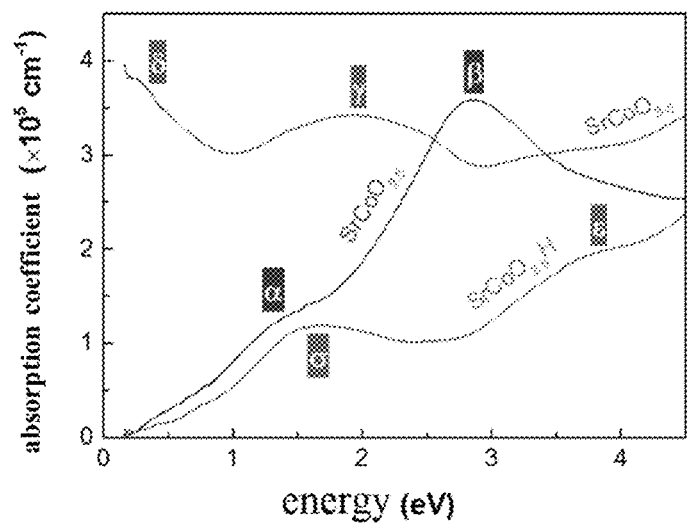
FIG. 15 shows absorption spectroscopies obtained from the transmittance spectra, provided in embodiments of the present disclosure.

Referring to FIG. 15, a comparison of absorption coefficients of optical absorption spectra obtained from the transmittance spectra of the three phases of the material of the embodiment of the present disclosure. It can be seen from the figure that when in an energy range below a photon energy of 4.0 eV, there are two main absorption peaks, i.e. intraband d-d transition ($\alpha$, $\sigma$, and $\delta$) at the low energy end and interband p-d transition ($\beta$, $\varepsilon$ and $\lambda$) at the high energy end, in all three structural phases. $SrCoO_{3-\delta}$ exhibits relatively strong light absorption at the whole spectrum band, which is consistent with its metallic nature. In addition, $SrCoO_{2.5}$ and $SrCoO_{2.5}H$ both exhibit an insulation property and form very strong absorptions ($\beta$ and $\varepsilon$) near the direct bandgaps. In addition, the light absorption by the $SrCoO_{2.5}$ phase is even greater than that by the $SrCoO_{3-\delta}$ phase at an energy range greater than the direct bandgap, owing to a larger p-d transition in the $SrCoO_{2.5}$ phase. However, regarding to the $SrCoO_{2.5}H$ phase, the absorption is strongly suppressed with the increase of the direct bandgap.

Figure 16:
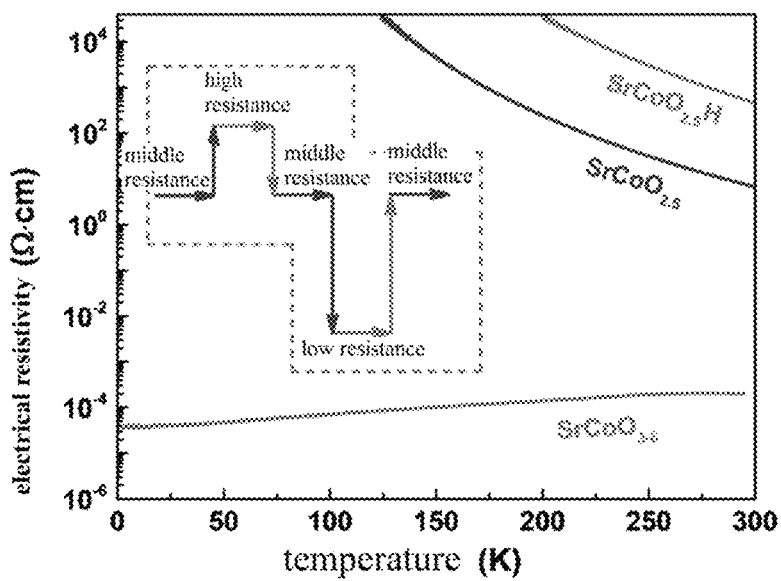
FIG. 16 shows electrical transport properties, including temperature dependence of resistivities, of the three structural phases, $SrCoO_{2.5}$, $SrCoO_{3-\delta}$, and $SrCoO_{2.5}H$, provided in embodiments of the present disclosure.

Referring to FIG. 16, it can be understood that the modulation to the transmittance spectra is derived from differences in energy band structure between the three different phases, which can be also reflected on the electrical transport. FIG. 16 shows the temperature dependence of resistivities of the three structure phases on the temperature, from which it can be seen that $SrCoO_{3-\delta}$ is a good metal and has a resistivity of about 200 $\mu\Omega\cdot cm$, and the $SrCoO_{2.5}$ phase and the $SrCoO_{2.5}H$ phase both show semiconductor behaviors and have resistivities of 8 $\Omega\cdot cm$ and 450 $\Omega\cdot cm$, respectively at room temperature. The inserted figure shows a reversible transformation among different resistance states among the three structural phases under the regulating of the electric field, i.e. middle resistance state→high resistance state→middle resistance state→low resistance state→middle resistance state. Therefore, the electric-field-controlled phase transformation among multi-resistance states realized by the present disclosure establishes a model device unit based on a resistance switching memory.

Figure 17:
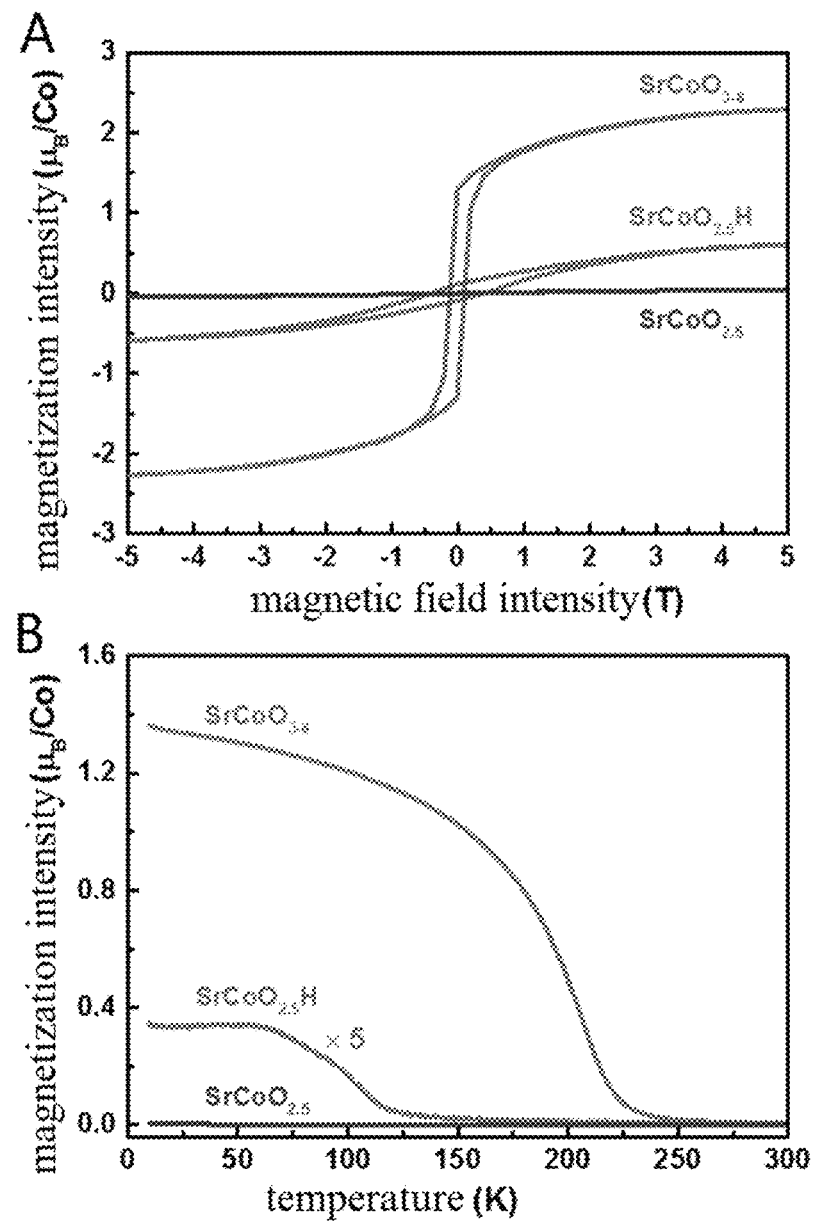
FIG. 17 shows magnetic characterizations of the three structural phases, provided in embodiments of the present disclosure.

Referring to FIG. 17, a tri-state magnetoelectric coupling phenomenon closely associated with the structural transition is shown, that is, the magnetic property of the material can be regulated by an electric field so as to achieve a multi-states magnetic memory. Through a macroscopic magnetic measurement, the obtained saturation magnetic moment of the $SrCoO_{3-\delta}$ phase is 2.4 $\mu L_B/Co$, the Curie temperature of the $SrCoO_{3-\delta}$ phase is 240 K, while $SrCoO_{2.5}$ only exhibits the intrinsic antiferromagnetic behavior of the material. In addition, in FIG. 17, the $SrCoO_{2.5}H$ phase also exhibits an obvious hysteresis loop, the saturation magnetic moment of the $SrCoO_{2.5}H$ phase is 0.6 $\mu_B/Co$, and the Curie temperature of the $SrCoO_{2.5}H$ phase is 125 K.

Figure 18:
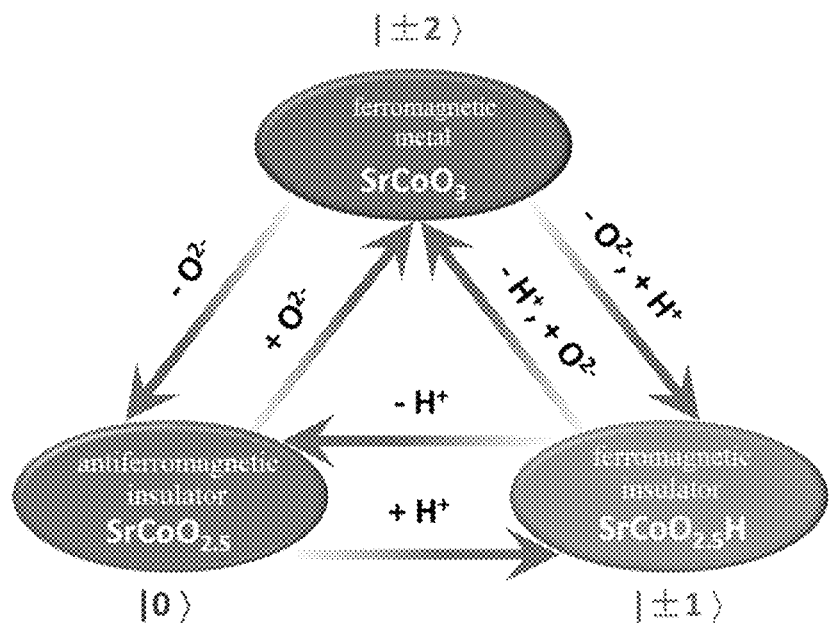
FIG. 18 shows a multi-state magnetoelectric coupling effect among the three structural phases, $SrCoO_{2.5}$ with a property of an antiferromagnetic insulator, $SrCoO_{2.5}H$ with a property of a ferromagnetic insulator, and $SrCoO_{3-\delta}$ with a property of a ferromagnetic metal, provided in embodiments of the present disclosure.

Referring to FIG. 18, this figure illustrates a regulation among three electrical and magnetic states resulting from the insertion/extraction of the oxygen ion and the hydrogen ion controlled by the electric field, which provides a new tri-state magnetoelectric coupling mechanism with a potential application value for a next generation electron device the magnetic property of which is controlled by an electric field.

Figure 19:
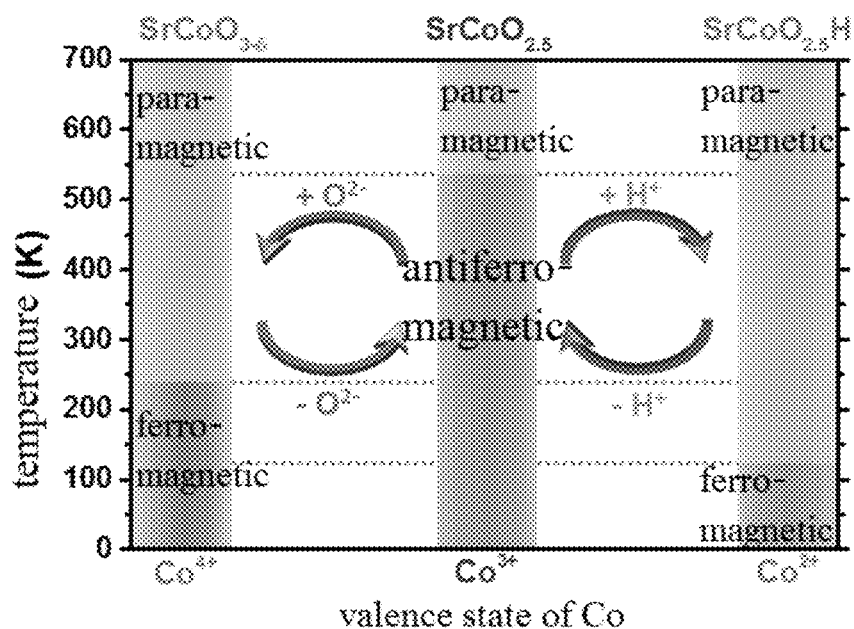
FIG. 19 shows a magnetoelectric coupling corresponding to a phase transformation of different magnetic ground states at different temperatures, provided in embodiments of the present disclosure.

Referring to FIG. 19, this figure shows that a transformation among magnetic properties at different temperatures is achieved by controlling the phase transformation or the valence state of Co via the electric field. For example, a ferromagnetic-antiferromagnetic-ferromagnetic transformation can be achieved at a temperature below 125 K; while a ferromagnetic-antiferromagnetic-paramagnetic transformation can be achieved between 125 k and 250 K; and a paramagnetic-antiferromagnetic-paramagnetic transformation can be achieved between 250 K and 537 K. In practical application, a switch among different magnetic ground states at different temperatures can be achieved by a method of controlling a movement of ion or the phase transformation via the electric field, thereby greatly enriching a range and a content of an electric control of magnetism.

Figure 20:
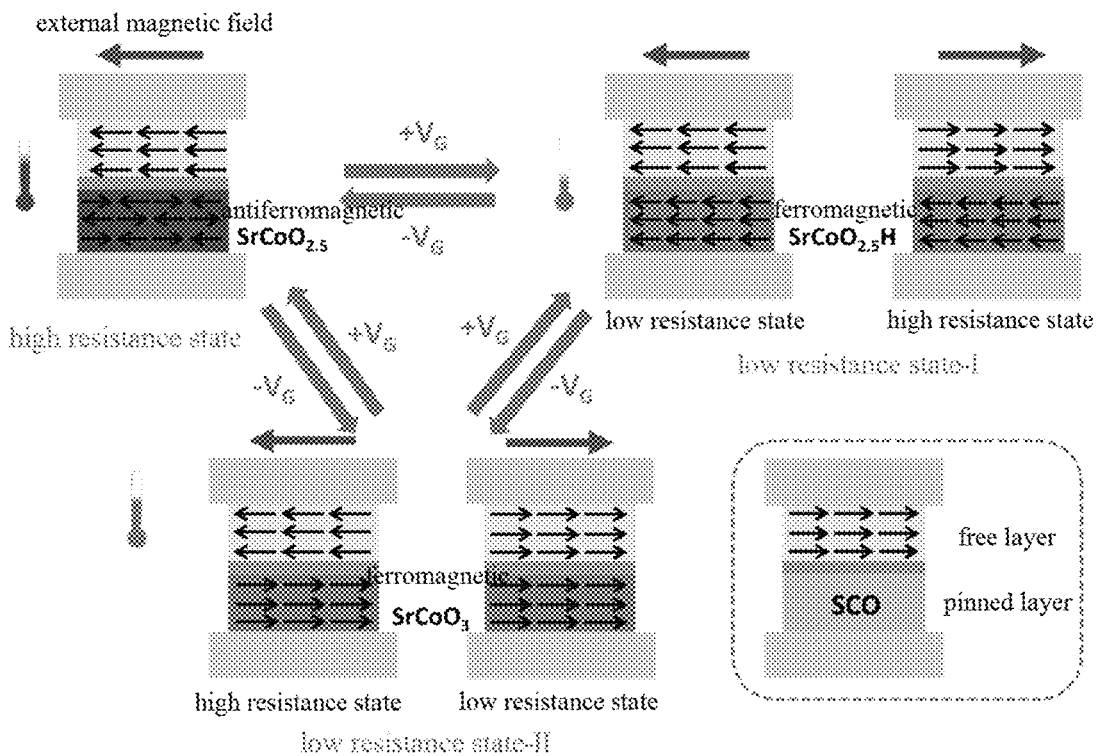
FIG. 20 shows a model of penta-state memory established upon the magnetoelectric coupling effect and spin value structure.

Referring to FIG. 20, a model of penta-state memory is established according to the magnetoelectric coupling and spin electronic effect on basis of the regulation to the magnetic ground states of the three phases. A spin-valve structure is established by using the three phases of $SrCoO_xH_y$ having different spin ground states as a spin pinned layer and an epitaxial magnetic metal as a spin free layer. When regulating the gating voltage and magnetic ground state, a high resistance state, a low resistance state-I, and a low resistance state-II can be achieved, wherein the low resistance states are each further distinguished into a high resistance state and a low resistance state, thereby realizing the penta-state memory finally.

Figure 21:
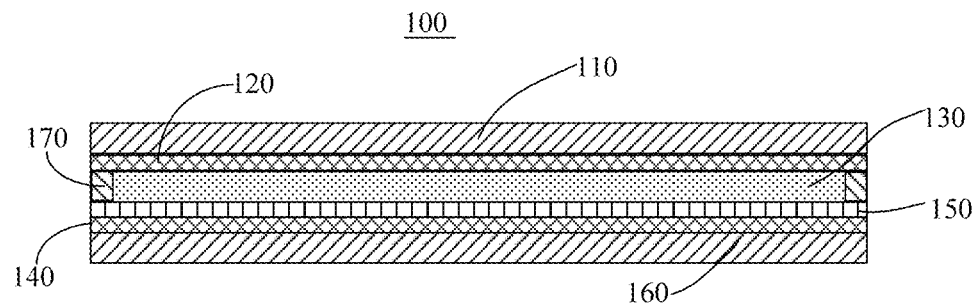
FIG. 21 is a structure schematic diagram of a phase transformation device provided in embodiments of the present disclosure.

Referring to FIG. 21, a phase transformation electron device 100 is further provided in combination with the hydrogen-containing transition metal oxide. The phase transformation electron device 100 can realize a mutual-reversible phase transformation among three phases under an action of an electric field. More specifically, the phase transformation electron device 100 can be an electrochromic smart glass, can be a multi-state resistance switching memory, and also can be a magnetic multi-state memory. The phase transformation electron device 100 includes a first conductive layer 120, a second conductive layer 140, an ionic liquid layer 130, and a phase transformation material layer 150. The ionic liquid layer 130 and the phase transformation material layer 150 are encapsulated between the first conductive layer 120 and the second conductive layer 140. The first conductive layer 120 is insulated from the second conductive layer 140 by an insulating support 170. The phase transformation material layer 150 is disposed on the second conductive layer 140. The phase transformation material layer 150 is formed by the hydrogen-containing transition metal oxide $ABO_xH_y$. The ionic liquid layer 130 is disposed between the phase transformation material layer 150 and the first conductive layer 120.

In combination with the above description, a gating voltage can be applied to the ionic liquid layer 130 and the phase transformation material layer 150 via the first conductive layer 120 and the second conductive layer 140, and a tri-state phase transformation of the phase transformation material layer 150 can be achieved by controlling the gating voltage. Under an action of an electric field, the phase transformation material is transformed among a first phase, a second phase, and a third phase. A lattice volume of the first phase is larger than a lattice volume of the second phase, and the lattice volume of the second phase is larger than a lattice volume of the third phase. In one embodiment, the first phase is $SrCoO_{2.5}H$, the second phase is $SrCoO_{2.5}$, and the third phase is $SrCoO_{3-\delta}$. An electrochromism and a tri-state magnetoelectric coupling can be achieved. Materials of the first conductive layer 120 and the second conductive layer 140 are not limited and can be selected according to actual needs. For example, if the phase transformation electron device 100 is used for the electrochromism, then the first conductive layer 120 and the second conductive layer 140 can be disposed to be transparent conductive layers. It is to be understood that the phase transformation material layer 150 itself can be used directly as the second conductive layer 140 and the second conductive layer 140 can be omitted. A material of the insulating support 170 is not limited, as long as the material is insulative and has certain hardness. The insulating support 170 can be a glass or others. A material of the ionic liquid layer 130 is the first ionic liquid. The ionic liquid layer 130 is used for providing the hydrogen element and the oxygen element required for the phase transformation.

In one embodiment, the phase transformation electron device 100 further includes a first substrate 110 and a second substrate 160 opposite to and spaced from the first substrate 110. The first conductive layer 120 is disposed on a surface of the first substrate 110, and the second conductive layer 140 is disposed on a surface of the second substrate 160. The first substrate 110 and the second substrate 160 are used for supporting and can be made by a material with certain hardness. Preferably, the first substrate 110 and the second substrate 160 are glasses.

What is described above are only several implementations of the present application, and these embodiments are specific and detailed, but not intended to limit the patent scope of the present application. It should be understood by the skilled in the art that various modifications and improvements can be made without departing from the conception of the present application, and all fall within the protection scope of the present application. It will also be appreciated that some of the steps of the methods of the present application may be performed in parallel or in a different order than illustrated. Therefore, the patent protection scope of the present application is defined by the appended claims.

What is claimed is:

1. A method for regulating a phase transformation of a hydrogen-containing transition metal oxide, comprising steps of:
   providing a hydrogen-containing transition metal oxide having a structural formula of $ABO_xH_y$, wherein the hydrogen-containing transition metal oxide is in form of a first phase, A is one or more of alkaline earth metal elements and rare-earth metal elements, B is one or more of transition metal elements, x is a numeric value in a range of 1 to 3, and y is a numeric value in a range of 0 to 2.5;
   soaking the hydrogen-containing transition metal oxide with a first ionic liquid capable of providing hydrogen ions and oxygen ions; and
   applying a gating voltage to the hydrogen-containing transition metal oxide through the first ionic liquid as a gate to regulate the phase transformation of the hydrogen-containing transition metal oxide.

2. The method of claim 1, wherein a method for making the hydrogen-containing transition metal oxide comprises:
   providing a transition metal oxide having a structural formula of $ABO_z$, wherein z is greater than or equal to 2 and smaller than or equal to 3;
   soaking the transition metal oxide with a second ionic liquid, wherein the second ionic liquid is capable of providing hydrogen ions and oxygen ions by ionizing water; and
   applying an electric field to the transition metal oxide to cause the hydrogen ions in the second ionic liquid to insert into the transition metal oxide.

3. The method of claim 2, wherein the applying the electric field to the transition metal oxide comprises:
   providing a second electrode and a power source;
   disposing the second electrode to be spaced from the first electrode and connecting the second electrode and the first electrode electrically and respectively to the power source; and
   soaking the second electrode with the second ionic liquid, and applying an electric field in a direction from the second electrode to the first electrode by the power source.

4. The method of claim 2, wherein the providing the transition metal oxide comprises:
   providing a substrate;
   depositing a film of the transition metal oxide having the structural formula of $ABO_z$ onto a surface of the substrate; and
   forming a first electrode on a surface of the film of the transition metal oxide.

5. The method of claim 4, wherein the substrate is one of a ceramic substrate, a silicon substrate, a glass substrate, a metal substrate, or a polymer.

6. The method of claim 4, wherein, the film of the transition metal oxide is obtained via an epitaxial growth on the substrate by using a pulsed laser deposition method.

7. The method of claim 4, wherein, the first electrode contacts the film of the transition metal oxide to form a bottom electrode.

8. The method of claim 1, wherein the applying the gating voltage to the hydrogen-containing transition metal oxide through the first ionic liquid as the gate comprises:
   applying a negative gating voltage to the hydrogen-containing transition metal oxide $ABO_xH_y$ to extract the hydrogen ions from or insert the oxygen ions into the hydrogen-containing transition metal oxide so as to cause the hydrogen-containing transition metal oxide to be in form of a second phase, wherein the second phase has a lattice volume smaller than that of the first phase.

9. The method of claim 8, wherein the applying the gating voltage to the hydrogen-containing transition metal oxide through the first ionic liquid as the gate comprises:
   applying a positive gating voltage to the hydrogen-containing transition metal oxide in the form of the second phase to insert the hydrogen ions into or extract the oxygen ions from the hydrogen-containing transition metal oxide in the form of the second phase so as to cause the hydrogen-containing transition metal oxide in the form of the second phase to revert back to the first phase.

10. The method of claim 8, wherein the applying the gating voltage to the hydrogen-containing transition metal oxide through the first ionic liquid as the gate comprises:
    applying a negative gating voltage to the hydrogen-containing transition metal oxide in the form of the second phase to insert the oxygen ions into or extract the hydrogen ions from the hydrogen-containing transition metal oxide in the form of the second phase so as to be in form a third phase, wherein the third phase has a lattice volume smaller than that of the second phase.

11. The method of claim 1, wherein the $ABO_xH_y$ is $SrCoO_{2.5}H$.

* * * * *